(12) United States Patent
Kim et al.

(10) Patent No.: US 10,170,729 B2
(45) Date of Patent: Jan. 1, 2019

(54) ELECTRICALLY CONDUCTIVE POLYMERS

(71) Applicants: Woohong Kim, Lorton, VA (US); Gary P. Kushto, Crofton, MD (US); Zakya H. Kafafi, Alexandria, VA (US)

(72) Inventors: Woohong Kim, Lorton, VA (US); Gary P. Kushto, Crofton, MD (US); Zakya H. Kafafi, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 573 days.

(21) Appl. No.: 14/270,654

(22) Filed: May 6, 2014

(65) Prior Publication Data

US 2015/0024532 A1     Jan. 22, 2015

Related U.S. Application Data

(63) Continuation of application No. 12/481,119, filed on Jun. 9, 2009, now abandoned.

(51) Int. Cl.
| | | |
|---|---|---|
| *H01L 51/56* | (2006.01) | |
| *H01L 51/52* | (2006.01) | |
| *H01L 51/00* | (2006.01) | |
| *H01B 1/12* | (2006.01) | |
| *H05B 33/28* | (2006.01) | |

(52) U.S. Cl.
CPC ............ *H01L 51/56* (2013.01); *H01B 1/128* (2013.01); *H01L 51/0021* (2013.01); *H01L 51/5206* (2013.01); *H01L 51/5215* (2013.01); *H05B 33/28* (2013.01); *H01L 51/006* (2013.01); *H01L 51/0037* (2013.01); *H01L 51/0094* (2013.01); *H01L 2251/5346* (2013.01); *Y02E 10/549* (2013.01)

(58) Field of Classification Search
CPC ................................ H01L 51/56; H01B 1/128
USPC ......................................... 438/46; 174/126.1
See application file for complete search history.

(56) References Cited

U.S. PATENT DOCUMENTS

| | | | | |
|---|---|---|---|---|
| 5,723,873 | A  * | 3/1998  | Yang ............................... | 257/40 |
| 7,132,174 | B2 * | 11/2006 | Wang et al. ..................... | 428/690 |
| 8,314,418 | B2 * | 11/2012 | Klein et al. ..................... | 257/40 |
| 2005/0184306 | A1* | 8/2005 | Parker et al. ................... | 257/99 |

OTHER PUBLICATIONS

Henry J. Snaith, Henry Kenrick, Marco Chiesa, Richard H. Friend, Morphological and electronic consequences of modifications to the polymer anode 'PEDOT:PSS', Polymer, vol. 46, Issue 8, 29 Mar. 2005, pp. 2573-2578, ISSN 0032-3861, 10.1016/j.polymer.2005.01.077. (http ://www.sciencedirect.com/science/article/pii/S0032386105001291).*

* cited by examiner

*Primary Examiner* — William H Mayo, III
*Assistant Examiner* — Hiram E Gonzalez
(74) *Attorney, Agent, or Firm* — US Naval Research Laboratory; Rebecca L. Forman

(57) ABSTRACT

An electrically conductive film suited to use as a transparent anode, a method of forming the film, and an electronic device comprising the film are disclosed. The device includes a conductive polymer electrode defining first and second surfaces and having an electrical conductivity gradient between the first and second surfaces. A second electrode is spaced from the second surface by at least one organic material layer, such as a light emitting layer.

1 Claim, 10 Drawing Sheets

ELECTRICALLY CONDUCTIVE POLYMERS

This is a continuation application of copending application Ser. No. 12/481,119 filed on Jun. 9, 2009, by Woohong Kim et al., titled "ELECTRICALLY CONDUCTIVE POLYMERS," the entire contents of which is incorporated herein by reference.

BACKGROUND

This disclosure relates to organic conducting films. It finds particular application in connection with an electrode formed from one or more electrically-conducting polymers and having two or more regions of different electrical conductivity. It is to be appreciated that the conductive films may find application in a variety of electronic devices, particularly opto-electronic devices, as well as in antistatic coatings and electromagnetic shielding applications.

Most opto-electronic devices, such as liquid crystal displays (LCDs), organic light-emitting devices (OLEDs), photovoltaic cells (PVs), and organic thin film transistors (OTFTs) employ one or more electrically conductive and transparent electrodes. Typically, various metal oxides, such as indium tin oxide (ITO) are used as electrodes, since they are highly conductive and transparent in the visible region. ITO, for example, can be vacuum vapor-deposited, sputtered, or pulsed laser deposited (PLO) onto glass or plastic substrates. ITO films with a surface resistance of less than 100 Ω/square and a high transparency of >90% can be easily obtained using these deposition methods. However, ITO has some disadvantages as an electrode material. Deposition techniques are carried out under vacuum and can be costly. Also, metal oxide films tend to be very brittle. They are generally not suitable for use with a flexible substrate since they tend to delaminate easily.

Recently, conducting polymers have attracted attention as a potential replacement for ITO in many electronic devices, especially for those using flexible substrates. This is primarily due to their good mechanical strength and ability to maintain their electrical and optical properties upon substrate flexing and bending (see, R. Paetzold, K. Heuser, D. Henseler, S. Roeger, G. Wittmann, and A. Winnacker, Appl. Phys. Lett., 82 (19), 3342, (2003)). Conducting polymers are particularly suitable, since their surface resistance does not seem to be affected either by sharp bending and/or by repeated bending cycles.

The application of conducting polymers as the electrode in polymer light-emitting devices (PLEDs) is disclosed, for example, in U.S. Pat. No. 5,766,515 to Jonas, et al. OLEDs fabricated on glass substrates using poly(3,4-ethylenedioxythiophene) (PEDOT) as the conducting polymer electrode and methoxyethylhexyloxy phenylenevinylene (MEH-PPV) as an emissive material are described. Molecular organic light-emitting diodes (MOLEDs) using an anode fabricated from a poly(3,4-ethylenedioxythiophene) and poly(styrenesulfonic acid) (PEDOT:PSS) conducting polymer and tris(8-hydroxyquinolinolato) aluminum (III) ($Alq_3$) as an emissive layer have also been described (see W. H. Kim, A. J. Makinen, N. Nikolov, R. Shashidhar, H. Kim, and Z. H. Kafafi, Appl. Phys. Lett., 80, 3844, (2002); and W. H. Kim, G. P. Kushto, H. Kim, and Z. H., Kafafi, J. Polym. Sci. Part B: Polym. Phys., 41, 2471, (2003).) High external electroluminescence quantum efficiency and high luminance MOLEDs using a low sheet resistance conducting polymer anode based on high fluorescence and high electron mobility silole derivatives have also been developed. (see W. H. Kim, L. C. Palilis, M. Uchida, and Z. H. Kafafi, Polymer Electrodes for Flexible Organic Light-Emitting Devices, Chem. Mat. 16, 4681 (2004).

These references suggest that conducting polymers are promising candidates as anode materials and may eventually replace the most widely used ITO electrodes in many opto-electronic and other electronic devices, especially those fabricated on flexible substrates. Conducting polymers provide another advantage in applications such as OLEDs and OPVs due to their relatively high work function. The energy barrier for hole injection may be lowered due to the higher work function of the conducting polymers (~5.0 eV) compared to that of ITO (~4.7 eV). The X-ray and ultraviolet photoelectron spectroscopic (XPS and UPS) of PEDOT:PSS films have been studied. (see, R. Schlaf, H. Murata, and Z. H. Kafafi, J. Electron Spectrosc. Relat. Phenom. 120, 149 (2001).) The work function of the PEDOT:PSS films was measured to be 5.0±0.2 eV, regardless of the surface sheet resistance and the presence of various additives such as surfactants, polyalcohols and high boiling point solvents. This is significant for devices where the conducting polymers are used as an electrode since the device performance (such as driving voltage and efficiency) is largely dependent on the subtle change in the work function of the electrode. Therefore, the injection of holes from the electrode (anode) is not a limiting factor since the energy barrier between the anode and the organic layer is maintained.

However, the long-term stability of the conducting polymer electrode remains a problem. Some chemical degradation or electrical shorting is experienced under a high electric field, especially at the interface between the conducting polymer electrode and the organic layers. Therefore these devices tend to have poor operational stability and show rather low brightness and efficiency. Further, OLEDs fabricated using conducting polymer electrodes show very high leakage current that results in a low rectification ratio. A high ratio is beneficial for high resolution matrix displays where cross-talk between adjacent lines has to be avoided.

FIG. 1 shows the typical current density-voltage-luminance characteristics of an OLED based on the hole transporter, N,N'-Bis(naphthalene-1-yl)-N,N'-bis(phenyl)benzidine (α-NPB) and $Alq_3$ as the electron transporter/emitter, fabricated using a conducting polymer as an anode and a Mg:Ag alloy as a cathode. The device shows symmetric current-voltage characteristics in forward and reverse bias and does not exhibit a diode behavior. A low rectification ratio of about 1 over the range of ±5V is observed. The device also shows a rather low luminance especially at higher voltage. These are common characteristics for OLEDs using the conducting polymer anode that are caused by the leakage current.

There remains a need for a conductive polymer electrode which addresses these problems.

INCORPORATION BY REFERENCE

U.S. Pat. No. 6,649,327, entitled METHOD OF PATTERNING ELECTRICALLY CONDUCTIVE POLYMERS, to Kim, et al., is incorporated herein by reference in its entirety. Disclosed therein is a method of patterning electrically conductive polymers including forming a surface of a conducting polymer on a substrate, applying a mask to this surface, applying irradiation to form regions of exposed conducting polymer and regions of unexposed conducting polymer, removing the mask, and gently removing by non-chemically reactive means, the regions of exposed conducting polymer.

BRIEF DESCRIPTION

In accordance with one aspect of the exemplary embodiment, an electronic device includes a conductive polymer electrode defining first and second surfaces. The electrode has an electrical conductivity gradient between the first and second surfaces. A second electrode is spaced from the second surface by at least one organic material layer.

In accordance with another aspect, a method of forming an electrically conductive film includes depositing a first solution comprising an electrically conductive polymer and a dopant on a substrate to form a first conductive layer. A second solution comprising a conductive polymer and a dopant is deposited on the first layer to form a second conductive layer with a different conductivity than the first layer. Prior to depositing the second solution, the method includes heating the first layer to lower a solubility of the first layer's conductive polymer in the second solution.

In accordance with another aspect, a method of forming an electrically conductive film includes depositing a solution comprising an electrically conductive polymer and optionally a dopant on a substrate to form a conductive layer. The conductive layer is irradiated to generate a conductivity gradient in the conductive layer.

DETAILED DESCRIPTION

Figure 1:
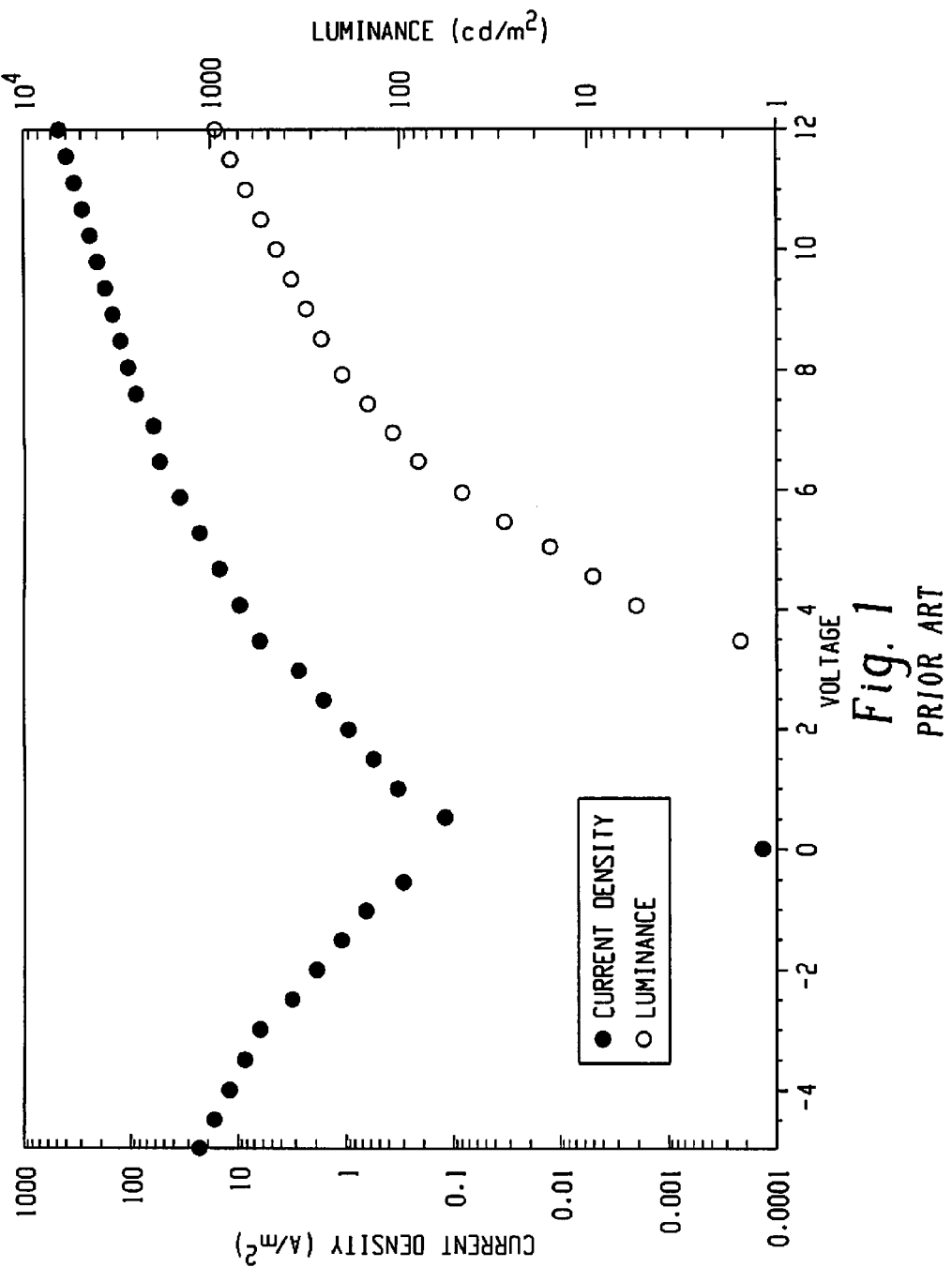
FIG. 1 is a plot of current density vs. voltage and luminance vs. voltage in the range of −5V to +12V for a comparative organic light emitting device with an electrically conducting polymer layer as an anode.

Aspects of the exemplary embodiment relate to an electronic device comprising an electrically-conducting polymer film and to a method of forming the device and film.

The electrically-conducting polymer film comprises an electrically conductive organic polymer which renders the film electrically conductive. For convenience. as used herein, the terms "conductive" and "conductivity" refer to electrical conductivity, unless otherwise noted. Electrical conductivity a is a measure of a material's ability to conduct an electric current. Conductivity can be expressed as Siemens per meter (S·m$^{-1}$). The conductivity a is defined as the ratio of the current density to the electric field strength. Where the electric field strength is a constant, current density (e.g., measured in amperes/unit area) can be used as a proxy for conductivity. Conductivity is the inverse of resistivity. Resistivity can be measured, for example, in ohms centimeter (Ω-cm) or ohms meter (Ω-m).

The electrically-conducting polymer film has a conductivity gradient. Specifically, conductivity in the electrically-conducting polymer film varies, whereby a first region of the film has a first conductivity and a second region of the film has a second conductivity, different from the first conductivity. In the exemplary embodiment, the conductivity varies across the film in a direction perpendicular to the opposed major surfaces (top and bottom) of the film. The conductivity differences may be provided by varying the concentration of the electrically conducting polymer, changing the type of electrically conducting polymer, or a combination thereof. The conductivity may vary stepwise or continuously.

In one embodiment, the electrically-conducting polymer film includes two or more discrete layers, whereby a first of the layers has a different conductivity from a second of the layers. The regions of the film are thus defined by the layers and the conductivity varies stepwise.

In another embodiment, the electrically-conducting polymer film is in the form of a single layer in which the conductivity continuously changes across the film. The regions are thus defined by regions of different conductivity.

In another embodiment, a method of forming the film with a stepwise varying conductivity includes applying successive layers to a common substrate. The applied layers may each include a conducting polymer and have a different conductivity. When formed, the polymer film thereby includes at least two layers which differ in their conductivity. In this embodiment, the conducting polymer is one which becomes insoluble upon solidification, whereby layers with different conductivity can be formed successively without affecting the intrinsic properties of the previously applied layer.

In another embodiment, a method of forming the film with a continuously varying conductivity gradient includes applying UV irradiation to a single layered conductive film, whereby a conductivity gradient is generated.

The exemplary methods provide stable and efficient conductive films suitable for many electronic, particularly optoelectronic, applications. The gradual distribution of the high electric field throughout the conductive films during the operation of the electronic device result in a dramatic decrease in the device degradation and hence an enhancement in the device stability and lifetime. Device performance is also improved by reducing current leakage.

The exemplary electrically-conducting polymer film is suitable for many applications where a stable conducting film is needed. As an example, it may be used as an electrode in organic light-emitting devices and organic photovoltaic cells where a high rectification ratio is desired to avoid cross-talk between adjacent lines.

Figure 2:
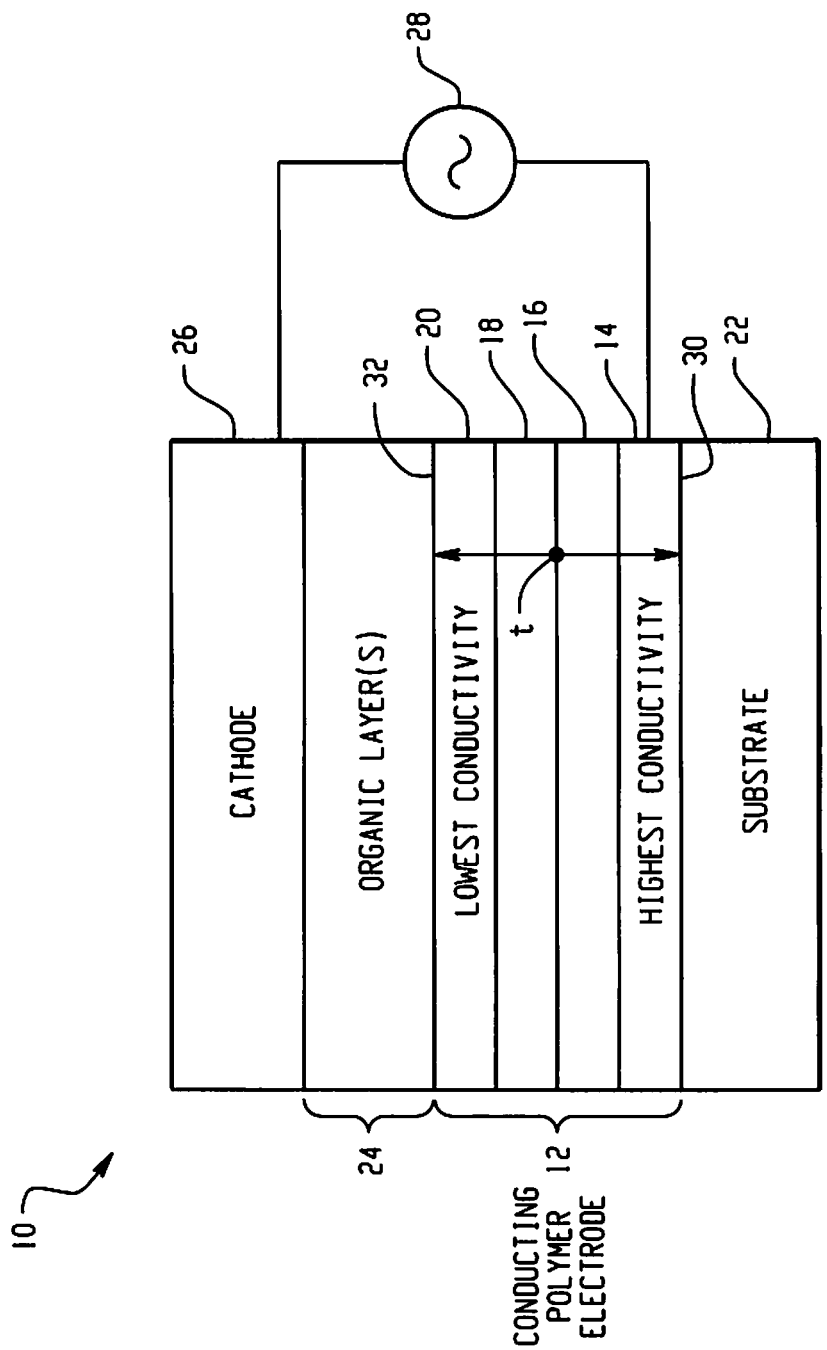
FIG. 2 illustrates an exemplary electronic device in accordance with one aspect of the exemplary embodiment.

FIG. 2, by way of example, illustrates an exemplary organic light emitting device (OLED) 10 in which the exemplary electrically conducting film 12 is in the form of a multi-layer electrode (here, the anode). The electrode 12 in FIG. 2 comprises multiple layers 14, 16, 18, 20 (four in the illustrated embodiment) which increase in conductivity towards an underlying substrate 22 (layer 18 has greater conductivity than layer 20, layer 16 greater than layer 18, and layer 14, greater than layer 16). The conductivity thus increases stepwise through the layer 12. The layer 14 has a conductivity which is greater than the underlying substrate 22. One or more organic material layers 24 space the anode 12 from a cathode layer 26. In the exemplary embodiment, the uppermost layer 20 of the film 12 has the lowest conductivity, yet still has a conductivity which is greater than that of the adjacent organic layer 24. A voltage source 28 is connected with the cathode 26 and anode 12 by electrical conductors.

The exemplary layers 14, 16, 18, 20 of the conductive film electrode 12 are coextensive with each other and supported by the underlying substrate 22. Specifically, layer 14 may be the first layer to be formed and contacts the substrate 22, layer 16 is the second layer, layer 18 is the third layer, and layer 20, the fourth. As will be appreciated, the number of layers of different conductivity in film 12 is not limited to four and can be, for example, from two to ten, or more. The film 12 has a first (lower) surface 30, defined by highest conductivity layer 14 and a second (upper) surface 32, defined by the lowest conductivity layer 20. The exemplary opposed surfaces 30, 32 are planar and parallel with each other, although other configurations of spaced first and second surfaces 30, 32 are contemplated. In the exemplary embodiment, the surface 30 is contiguous with the substrate 22, contacting the substrate along a predominant portion of its length. The surface 32 is contiguous with one of the organic material layers 24, and may contact the organic layer along a predominant portion of its length.

Layers 14, 16, 18, 20 of the film may each have a thickness of less than 200 nm, e.g., about 10-100 nm, and the entire anode 12 may have a thickness of up to 1 µm, e.g., 50-200 nm.

Figure 3:
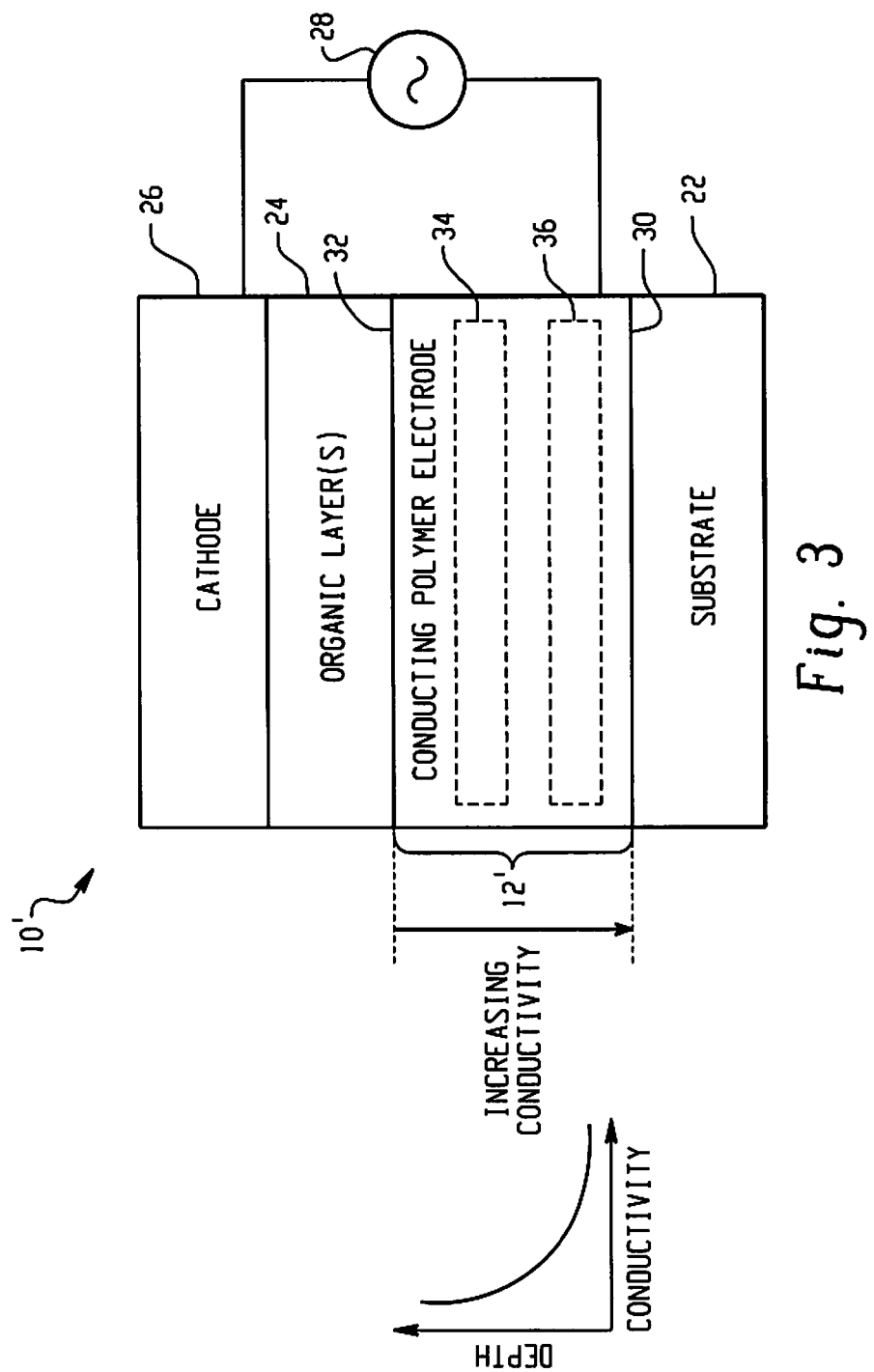
FIG. 3 illustrates an exemplary electronic device in accordance with another aspect of the exemplary embodiment.

FIG. 3 shows another embodiment of an OLED 10' in which similar elements are accorded the same numerals. Device 10' may be configured as for device 10, except as otherwise noted. In this embodiment, the anode 12' comprises a single electrically conductive film layer with a conductivity which decreases gradually from its lower surface 30 towards its upper surface 32. Accordingly, a region 34 of the layer 12', which is spaced from the lower surface (i.e., closer to the organic layer(s) 24), has a lower conductivity than a region 36, which is closer to the lower surface 30 (i.e., further from the organic layer(s) 24).

Suitable substrates 22 for the exemplary devices 10, 10' are transparent supports, such as glass, quartz, silicon wafer, or films of plastic such as polyester, for example, polyethylene terephthalate (PET) polyethylene naphthalate, polycarbonates, polyacrylates, polysulfones, polyimide, polyetherketones, waxes, polyesters, polyvinylacetates, polyolefins, polyethers, polyesters, polyvinylmethylethers, polyvinylbutylethers, polyamides, polyacrylamides, polyimides, polyketones, fluoropolymers, aromatic hydrocarbon polymers, acrylate and acrylic acid polymers, phenolic polymers, polyvinylalcohols, polyamines, polypeptides, siloxane polymers, polyvinylchlorides, polyvinylbenzylchlorides, polychlorostyrenes, polyvinylbutyrals, copolymers thereof, and combinations thereof. The support 22 may be rigid or flexible.

The exemplary electrically conductive film 12, 12' as well as other layers of the device 10, 10' can be formed by various methods including spin coating, inkjet printing, spray printing, screen printing, dip coating, combinations thereof, and others.

Exemplary conducting polymers which may be employed in the layer 12, 12' include polythiophenes, polyanilines, polypyrroles, and their derivatives, and combinations thereof. The conducting polymer(s) may be in a neutral state or doped with various dopants. The conducting polymer(s) may be soluble in various solvents or dispersed in water or other solvents as a complex with a dopant. In one embodiment, the conducting polymer comprises a complex of PEDOT (poly(3,4-ethylenedioxythiophene)) and a polymeric dopant, PSS (poly(styrenesulfonic acid).

As will be appreciated, the basic structure of the PEDOT and/or PSS polymer can be modified through the addition of substituent groups. Additionally a ratio of PEDOT:PSS can be adjusted to provide various concentrations of the conducting polymer, PEDOT, in the film.

In the embodiment of FIG. 2, the conductivity of the layers 14, 16, 18, 20 can be controlled by adjusting the ratio of PEDOT:PSS (which is expressed in terms of a mole ratio throughout). In the exemplary embodiment a ratio $R=R_1/R_2$ is at least 1.2:1, where $R_1$ is the PEDOT:PSS ratio in one of layers 14, 16, 18, and $R_2$ is the PEDOT:PSS ratio in a higher layer 16, 18, or 20. In some embodiments, the ratio R may be at least 1.5:1, e.g., at least 2 or at least 4 (e.g., between the highest and lowest conductivity layers) and can be up to 100 or more. The ratios $R_1$, $R_2$, etc. for the various layers can be, for example, from about 100:1 to 1:50. In general, the conducting polymer concentration is highest in the layer 14 that is closest to the substrate 22 (layer) and decreases with each successive layer. Analogously for FIG. 3, spaced regions 36, 34 can have a ratio $R=R_1/R_2$ which is at least 1.2:1, with the ratio varying gradually between the two regions.

The conductivity of the layers 14, 16, 18, 20 or regions 34, 36 may range between about 1000 and $10^{-6}$ S cm$^{-1}$. For example, the highest conductivity layer 14/region 36 may have a conductivity which is at least ten times the conductivity of the lowest conductivity layer 20/region 34. In some embodiments the ratio of highest:lowest conductivity may be at least 100:1 or at least 1000:1.

In the exemplary embodiment, no layer/region of the anode 12, 12' is entirely lacking in conductive polymer. For example, the conductive polymer may be present at ≥0.1% by weight in the lowest conductivity layer 20. In some embodiments, the same conductive polymer is used in all layers/regions of the anode 12, 12'. For example, each layer 14, 16, 18, 20/region 36, 34 includes PEDOT as the conductive polymer. In some embodiments, the same dopant is used in all layers/regions of the anode 12, 12'. For example, each layer 14, 16, 18, 20/region 36, 34 includes PSS as the dopant.

The total thickness t of the film 12, 12' can be adjusted by controlling the thickness of each layer. In either embodiment, the total thickness of the film 12, 12' is generally less than 1 µm, e.g., about 100-200 nm.

The cathode 26 (negative electrode) layer of the organic electroluminescence device may comprise an active metal material having a small work function (generally 4 eV or less) to inject an electron into the organic material layer effectively. The cathode may be formed from a conductive metal, such as an alloy of magnesium and silver. Other materials suitable for the cathode layer include metals, such as Al, Ti, In, Na, K, Mg, Li, Cs, Rb, rare earth metals, and alloy compositions, such as Na—K alloy, Mg—Cu alloy, Al—Li alloy. In other embodiments, the cathode layer 26 can be formed of the same materials as the anode layer 12, 12'.

The cathode layer 26 may have a thickness of 1 μm or less, e.g., 20-200 nm.

There are numerous configurations of the organic layers 24. The essential requirements of an OLED are an anode, a cathode, and an organic light-emitting layer located between the anode and cathode. Additional layers may be employed as exemplified in the typical device 10" of FIG. 4, where layer 12 can be as described for the embodiment of FIG. 2 or FIG. 3. In this embodiment, the organic layers 24 include, in order, an optional (positive charge) hole-injecting layer 40, an optional hole-transporting layer (HTL) 42, a light-emitting layer 44, an optional hole-blocking layer 46, and an optional electron-transporting layer 48, which are sequentially arranged between the anode 12 and the cathode 26. The total combined thickness of the organic layers can be less than 500 nm.

In other embodiments (not shown) the substrate 22 may alternatively be located adjacent to the cathode 26, or the substrate 22 may actually constitute the anode 12 or cathode 26.

Figure 5:
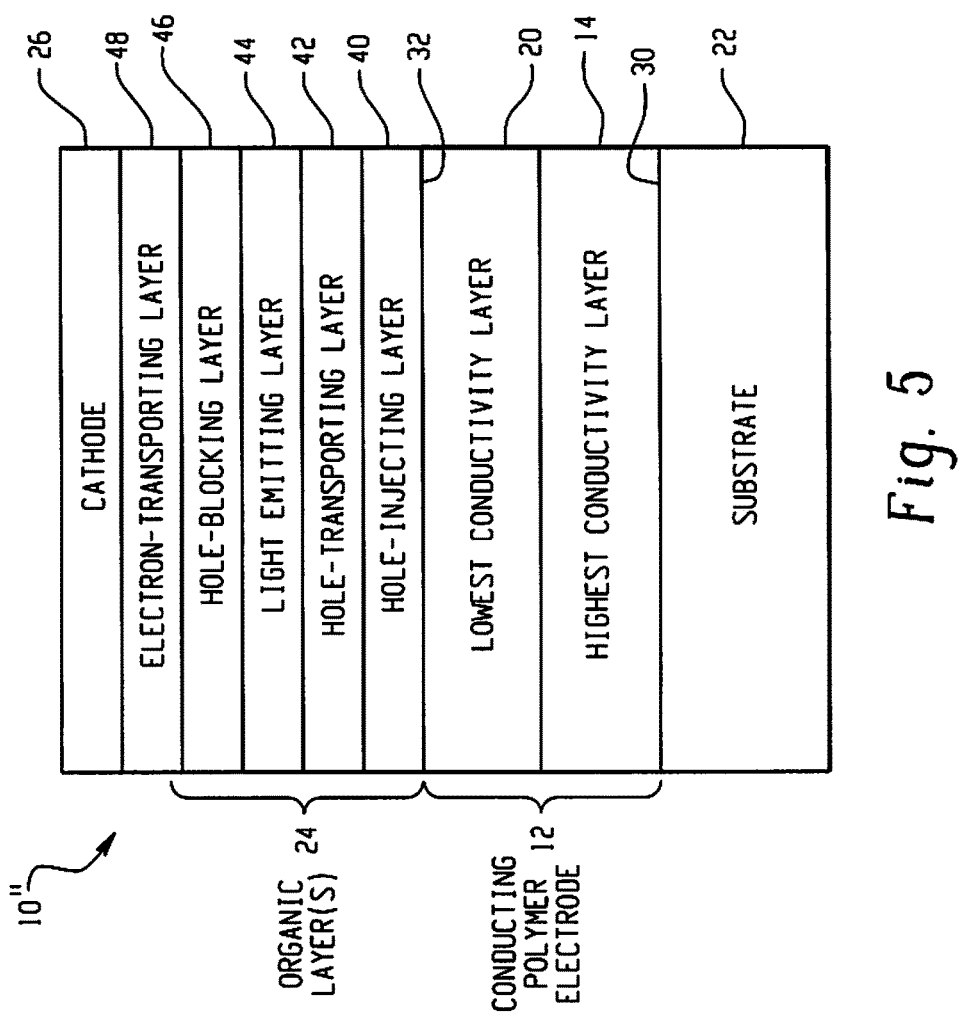
FIG. 5 illustrates an exemplary electronic device in accordance with another aspect of the exemplary embodiment.

As shown in FIG. 5, a hole-injecting layer 40 may be provided between anode 12 and hole-transporting layer 42. The hole-injecting material can serve to improve the film formation property of subsequent organic layers and to facilitate injection of holes into the hole-transporting layer 42. Suitable materials for use in the hole-injecting layer 40 include porphyrinic compounds, as described in U.S. Pat. No. 4,720,432, plasma-deposited fluorocarbon polymers as described in U.S. Pat. No. 6,208,075, and some aromatic amines, for example, 4,4',4"-tris((3-methyl phenyl)phenylamino]triphenylamine (MTDATA). The thickness of the hole-injection layer can be in the range of 0.2 to 200 nm and suitably in the range of 0.3 to 1.5 nm. The positive hole-injecting layer is sometimes referred to as an anode buffer layer.

The hole-transporting layer (HTL) 42 is an organic layer that is readily able to transport the holes supplied by the anode 12. The hole-transporting layer 42 contains at least one hole-transporting compound such as an aromatic tertiary amine, which can be an arylamine, such as a monoarylamine, diarylamine, triarylamine, or a polymeric arylamine, which is optionally substituted with a vinyl group. Exemplary triarylamines are described in U.S. Pat. Nos. 3,180,730; 3,567,450; 3,658,520; 4,720,432; and 5,061,569. In one exemplary embodiment, the organic hole transport layer 42 includes a triarylamine, such as naphthyl-substituted benzidine derivative, such as 4,4'-bis[N-(1-naptithyl-D-N-phenyl-amino]-biphenyl (α-NPD), N,N'(3-methylphenyl)-1,1"-biphenyl-4,4'-diamine, (TPD), or a mixture thereof. Layer 42 may have a thickness of 10-500 nm, e.g., 50 nm. The structure of α-NPD is given below:

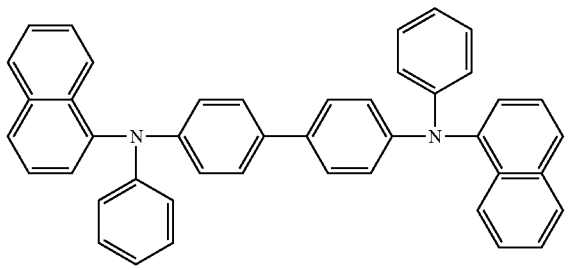

The organic light emission layer 44 emits light when a voltage is applied across the device. The light emission layer may comprise any material commonly known the art for such use. In one embodiment, the light emission layer comprises a light emitting material, such as tris(B-hydroxyquinoline) aluminum (III) (Alq$_3$), a polyphenylene vinylene (PVV) derivative, a polyfluorene derivative, or combination thereof, which may be used alone or combined with a fluorescent dye. Other exemplary emitters are silole derivatives having benzene rings in the skeleton, such as 1,2-bis (1-methyl-2,3,4,5,-tetraphenylsilacyclopentadienyl)ethane (2PSP), which has the formula given below:

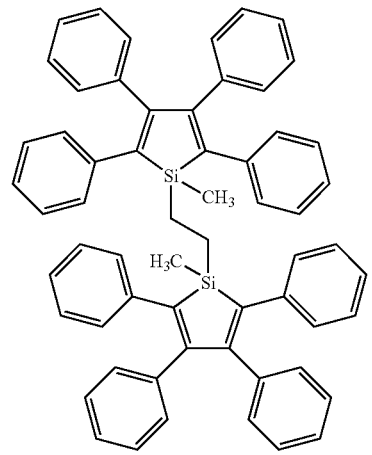 [SMILES: C[Si]1(CC[Si]2(C)C(c3ccccc3)=C(c3ccccc3)C(c3ccccc3)=C2c2ccccc2)C(c2ccccc2)=C(c2ccccc2)C(c2ccccc2)=C1c1ccccc1]

The hole-blocking layer 46 (or multiple hole blocking layers) may be located between the electron-transporting layer 48 and the light-emitting layer 44 to help confine the excitons or recombination events to the light-emitting layer. Examples of useful hole-blocking materials are bathocuproine (BCP), bis(2-methyl-8-quinolinolato)(4-phenylphenolato)aluminum(III) (BAlq) and fac-iridium(III) tris(1-phenylpyrazolato-N,C$^2$). Other metal complexes known to block holes and excitons are described in U.S. Pub. No. 2003/0068528. When a hole-blocking layer is used, its thickness can be between 2 and 100 nm, such as between 5 and 10 nm.

The electron-transporting layer 48, where present, may include one or more metal-chelated oxinoid compounds, including chelates of oxine itself (also commonly referred to as 8-quinolinol or 8-hydroxyquinoline). Such compounds help to inject and transport electrons, exhibiting high levels of performance, and are readily fabricated in the form of thin films. Other electron-transporting materials suitable for use in the electron-transporting layer 48 include various butadiene derivatives as disclosed in U.S. Pat. No. 4,356,429 various heterocyclic optical brighteners as described in U.S. Pat. No. 4,539,507, and silacyclopentadiene (silole) derivatives. Exemplary compounds of this type include 2,5-bis-(2',2"-bipyridin-6-yl)-1,1-dimethyl-3,4-diphenylsilacyclopentadiene (PyPySPyPy), which has the formula below:

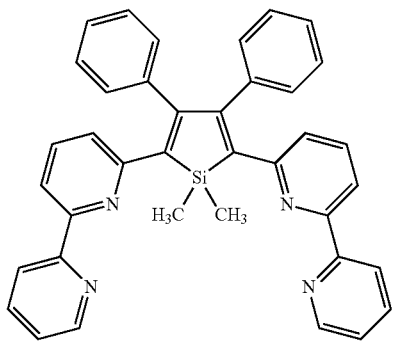 [SMILES: C[Si]1(C)C(c2cccc(-c3ccccn3)n2)=C(c2ccccc2)C(c2ccccc2)=C1c1cccc(-c2ccccn2)n1]

Layer 48 may have a thickness of 10-500 nm, e.g., less than 50 nm.

Two or more OLEDs, as disclosed herein, may be formed on a common substrate 22. In another embodiment, a display such as a TV screen includes an array of OLEDs as described herein.

The polymer film 12, 12' also finds application as an electrically conductive and transparent electrode (e.g., anode) in other electronic devices, such as liquid crystal displays (LCDs), organic photovoltaic cells (OPVs), organic thin film transistors (OTFTs), and the like.

Exemplary methods for forming the layer and devices comprising it are described in general terms followed by several specific examples.

The substrate 22 is initially cleaned thoroughly using conventional methods, such as water, and dried, e.g. with a flow of nitrogen gas. Oxygen plasma treatment and/or UV/ozone treatment may be applied where high adhesion properties are desired.

The conducting polymer electrode 12, 12' can be formed in two different ways: a) forming multiple layers of conducting polymer films with different electrical conductivity (as for the device of FIG. 2) and b) forming a single layer conducting polymer film in which the electrical conductivity changes gradually across the film (as for the device of FIG. 3). These methods have been demonstrated to work well on several types of substrates including glass, ITO glass, various plastic films, and Si wafers. While these substrates are generally non-conducting, ITO a conducting substrate. In this case, the conductive polymer layer acts as a buffer layer.

The conducting polymer, PEDOT:PSS, is selected as an example for describing the method. The multilayer film of the conducting polymer may be wet processed by various casting and printing techniques from solutions or dispersions. For example, the conducting polymer may be spin-coated onto the substrate as an aqueous dispersion. Exemplary spin coating parameters are speeds between 100 to 5000 rpm for about 5-500 seconds. A small amount of alcohol or surfactant may be added to the dispersion before spin coating to increase the uniformity and adhesion property of the film. A process, either chemical or physical, to promote the adhesion properties can be applied prior to or together with the coating. The film is subsequently heated, resulting in a pinhole-free film with excellent optical qualities. An exemplary heating temperature is between 50-300° C. for 3-10 minutes.

In the case of the multilayer film 12 (FIG. 2), the film is built up by coating and then heating each layer in turn, the composition of each dispersion being different to achieve the desired conductivity gradient. First, the PEDOT:PSS with the highest conductivity (highest PEDOT:PSS ratio) is coated onto the substrate. The film is subsequently annealed resulting in a pinhole-free and insoluble layer 14 which can resist most organic solvents and even hot water. The conducting polymer with the next highest conductivity is coated and annealed in a similar way. This process is repeated until the conducting polymer layer 20 with the lowest conductivity is formed. The number of layers is equal to or more than two. The multiple-layered conducting polymer film 12 now can serve as a stable and efficient electrode for many applications. The conducting polymer film can be patterned in any step, if desired, e.g. to form multiple anodes on a common substrate.

This method avoids many of the problems involved with conventional methods for forming multi-layered films. Generally, the formation of a multi-layered film is extremely difficult, since the film in the bottom layer is dissolved during the formation of the subsequent layer. The morphology and the properties of the preceding film layer are thus disrupted. In the present method, the annealing process applied to the film layers prior to applying a subsequent layer creates a film layer which is insoluble in the subsequently applied layer.

Conducting polymers are available as aqueous dispersions of poly(3,4-ethylenedioxythiophene) and poly(styrenesulfonic acid) (PEDOT:PSS). For example, PEDOT:PSS dispersions are available from Bayer, Germany under the trade name BAYTRON P and from Agfa-Gavaert under the trade name ORGANCON. PEDOT:PSS has properties which make it particularly suited to this application. Once it is solidified by annealing the polymer film, at a suitable temperature, it is not soluble in most of organic solvents and even in hot water. Additionally the conductivity of the films is conveniently adjusted by varying the ratio of poly(3,4-ethylenedioxythiophene) to poly(styrenesulfonic acid). PEDOT:PSS dispersions are available at different bulk resistivities, thereby providing a range of conductivity for the layers. Alternatively or additionally, the conductivity of the film can be controlled by diluting the PEDOT:PSS dispersion with additional PSS. Generally, lower conductivity is obtained from the higher ratio of PSS in PEDOT:PSS composition. For example, the molar ratios of PEDOT:PSS for the resistivities of 1, 100, and 100,000 Ohms-cm (i.e., conductivities of 1, 0.01, and 0.00001) are 1:2.5, 1:6, and 1:20, respectively. Thus, a large variation in conductivity across the film 12 can be achieved by selection of appropriate PEDOT:PSS ratios for the aqueous dispersions. Since the only difference in each conducting polymer layer is the ratio of PEDOT:PSS, the intrinsic properties of the film, such as work function and optical properties are not affected.

For conductive polymers which do not become insoluble through annealing, other options to form multi-layered films from solution include the selection of two incompatible solvents for the film formation of each layer so that it is not dissolved during the formation of the next layer.

To form a single layer conducting polymer electrode 12' with continuous change in conductivity (FIG. 3), a photo-irradiation technique is used to decrease the conductivity in a gradual manner across the film 12'. For example, the film is irradiated with light from a UV light source having a wavelength in the range of 150-400 nm for a period of 1-10,000 seconds. (The term "light" is used generally here to refer to radiation of all wavelengths below about 750 nm and is not limited to the visible region). The time of exposure and the wavelength range of the light are selected to be less than that which would result in loss of adhesion of the layer to the underlying substrate.

It is proposed that the exposure of conducting polymers based on conjugated polymers to UV light decreases the electrical conductivity of the polymers due the decrease in conjugation length caused by the oxidation of the aromatic rings. The change in electrical properties is determined by the intensity and the wavelength of UV light used. Since the penetration depth of the light of a specific wavelength through the conducting polymer film is primarily determined by the absorbance of the polymer film, the conductivity across the film can be conveniently controlled by selecting a suitable light source and adjusting the exposure time. Highly absorbing light will mainly modify the properties of the shallow portion of the films since most light will be absorbed near the surface. On the other hand, the light with low absorbance will penetrate to the deeper portion of the film and the degree of deterioration will be quite even across the film thickness. Thus the time of exposure and range of wavelengths used may be selected to provide a desired conductivity gradient.

Figure 4:
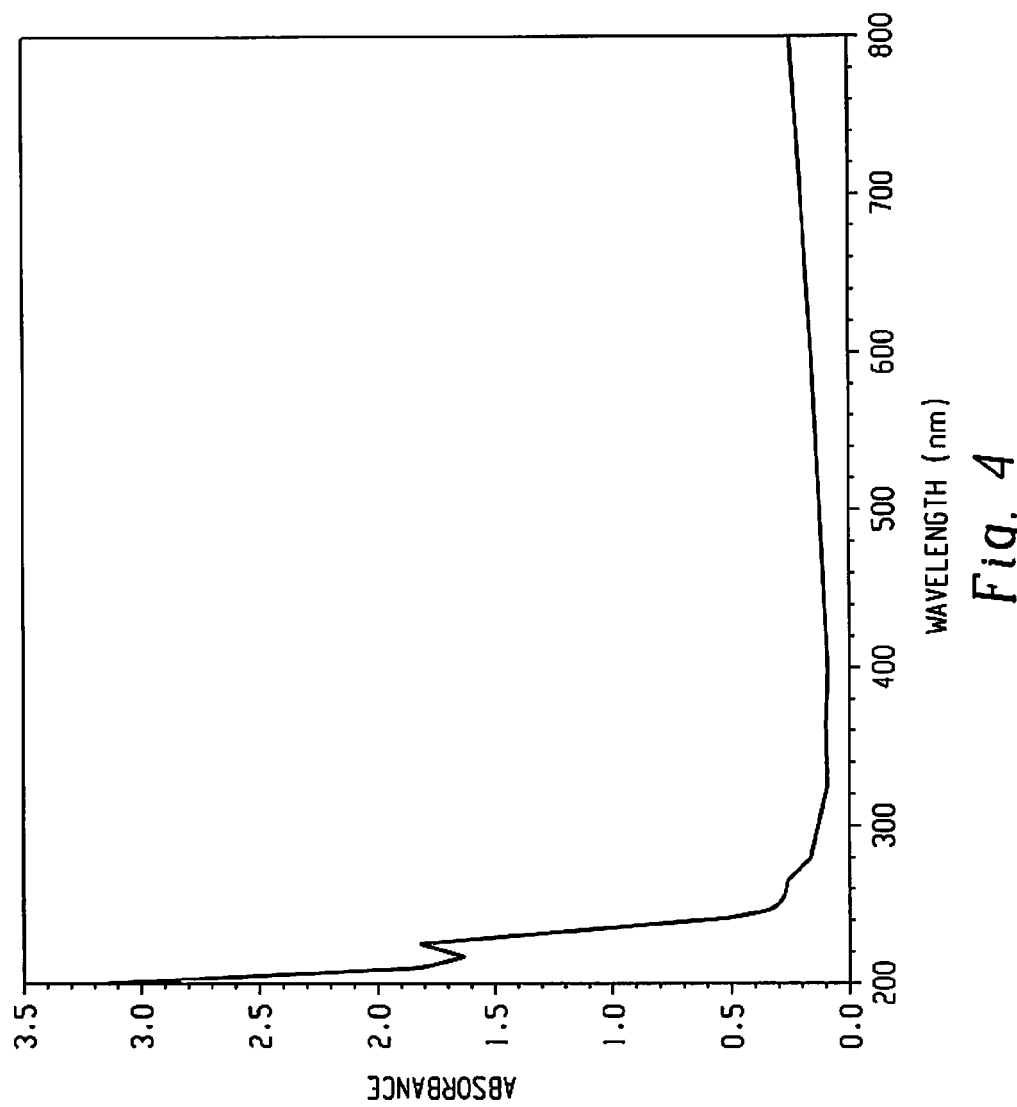
FIG. 4 is an absorption spectrum showing absorbance as a function of the wavelength of light irradiating a 150 nm thick film of PEDOT:PSS on a quartz substrate.

FIG. 4 for example, shows the absorption spectrum of a PEDOT:PSS film of 150 nm thickness on a quartz substrate. The film is formed from a dispersion. It is seen that the PEDOT:PSS film is quite transparent in the visible region and starts to absorb light in which the wavelength is shorter than 280 nm. Therefore, the penetration depth of that portion of the light having a wavelength shorter than 280 nm will be reduced compared to the portion having wavelengths longer than 280 nm. The change in the conductivity due to the reduced conjugation and chain scission caused by photo-induced degradation is proportional to the amount of light exposure. Most of the light below 240 nm will not penetrate into a deeper layer due to the high absorbance of the PEDOT:PSS in the upper region. Therefore, the conductivity will be the lowest near the surface where photodegradation occurs most and will gradually change and, will be the highest at the interface between the substrate and the conducting polymers.

To form multiple anodes on a single substrate, the anode layer 12, 12' formed by either method may be patterned. Patterning may be performed by the method disclosed in U.S. Pat. No. 6,649,327. In particular, a photo-irradiation technique is used to weaken the adhesion properties between the conducting polymer and substrate 22. For example, it may be exposed to a UV light source (wavelength<400 nm) through a patterned photomask on top of the substrate. Patterning typically takes much longer than the UV irradiation step, described above. For example, the length of patterning is typically longer than 30 minutes and can be as long as 10 hours, depending on the thickness of the film. The substrate may be heated during light exposure to accelerate the photoreaction. The organic materials are easily removed by rinsing or sonicating the substrate in mild organic solvent and/or water for about 1-20 seconds. The photo-irradiation of the film 12, 12' reduces the adhesion properties of the conducting polymer allowing it to be easily or gently removed from the substrate during sonication.

One or more organic material layers 24 can be formed on the optionally patterned anode layer 12, 12' by conventional film-forming techniques. In the case of an OLED, these may include an optional hole-injecting layer 40, an optional hole-transporting layer 42, a light-emitting layer 44, an optional hole-blocking layer 46, and an optional electron-transporting layer 48. A cathode layer 26 can be formed on top of the organic layer(s).

As will be appreciated, the method may be performed in essentially the reverse order by depositing a cathode layer 26 on a substrate analogous to substrate 22, thereafter depositing one or more organic material layers 24 and thereafter forming the anode 12 by laying down the least concentrated (lowest conductivity) conductive polymer layer first on the organic layer(s) 24 and laying down one or more subsequent conductive polymer layer(s), the conductivity of each subsequent layer being higher than that of the previously deposited layer.

The methods disclosed herein enable the formation of a stable and efficient conducting polymer electrode 12, 12' that is suitable for many electronic, e.g., opto-electronic applications. The methods form a conducting polymer electrode in which the conductivity of the film decreases gradually or stepwise across the film thickness. The conductivity of the lowest conductive layer is suggested to be greater than that of the active semiconductor layer that is formed on top of it. This conducting polymer electrode can enhance the device performance and operational stability since device degradation caused by high electric field at the organic electrode interface is greatly reduced. An even distribution of the charges and attenuation of the electric field through the multi-layered organic electrode with varying conductivity can prevent the device failure or degradation caused by the micro-shorts occasionally observed from single layered conducting polymer electrode devices. The introduction of additional layer/layers between the conducting polymer anode and the organic layer can be used to smooth the surface of the conducting polymer film and result in better interfacial properties. This effect can be obtained by forming additional layer/layers of conducting polymers with lower conductivity than the bottom conducting polymer electrode layer. Since a direct contact of the organic semiconductor layer to the conducting polymer electrode is prevented, device failure caused by the micro-shorts in the interface will be dramatically decreased.

Some advantages of the exemplary embodiments are that the intrinsic properties of the conducting polymer electrode, such as work function and optical properties, are not changed upon the formation of the multi-layer/continuously graduated films. This is because the conductivity of the final film in case of PEDOT:PSS is determined, at least in part, by the ratio of the conducting polymer (PEDOT) to the polymeric dopant (PSS). Maintaining a high work function is desirable for many applications, such as organic light-emitting devices (OLEDs) and organic photovoltaic cells (OPVs). For example, a high work function in an OLED promotes efficient hole-injection from the anode to the hole transporting layer (HTL). It also increases the open circuit voltage of OPV cells, which is of great advantage for high efficiency devices. A decrease in the leakage current caused by planarization of the conducting polymer electrode is also expected and this will result in the improvement of the device performance such as efficiency and rectification ratio.

The exemplary methods disclosed herein are able to form a stable and efficient conducting polymer electrode, in which the device performance is greatly enhanced due to the minimization of the direct contact of the organic layer to the high electric field and to the even distribution of the field across the conducting polymer film.

Without intending to limit the scope of the exemplary embodiment, the following examples describe the preparation of electrodes and devices in accordance with the exemplary methods disclosed herein.

EXAMPLE 1

Formation of a Multilayer Conducting Polymer Electrode

Substrates 22 (glass, plastic, or silicon wafer) are thoroughly cleaned and dried with $N_2$. They are briefly treated with O₂ plasma or UV/Ozone prior to the film formation. Aqueous dispersions of conducting polymer, poly(3,4-ethylenedioxythiophene) poly(styrenesulfonate) (PEDOT/PSS), with various conductivities are obtainable from Agfa-Gevaert N.V. Belgium and Bayer, Germany. For example, three different PEDOT/PSS dispersions are available from Bayer under the tradename BAYTRON P with a bulk resistivity of 1, 100, and 100,000 Ohms-cm, respectively. PEDOT:PSS with lower resistivity (<0.01 Ohms-cm) is obtainable from Afga-Gevaert under the tradename ORGANCON PEDOT coating solution.

First, the lowest resistivity (highest conductivity) PEDOT:PSS dispersion obtained from Agfa-Gevaert is spin coated onto the substrates at speeds between 500 to 5000 rpm for 180 sec. After spin coating, the film 14 is annealed at 20 to 200° C. for 1 to 200 minutes. The annealing renders the conducting polymer insoluble in the aqueous dispersion next applied. Then, PEDOT:PSS with a resistivity of 1 Ohm-cm is coated and annealed in a similar way. A similar procedure is repeated with the higher resistivity PEDOT:PSS dispersions (100 and 100,000 Ohms-cm). A uniform and pinhole free conducting polymer film 12 is formed and there is no film deformation generally caused by the dissolution of the sublayer upon multilayer formation. The total thickness of the film is generally less than 1 µm.

EXAMPLE 2

Formation of a Second Multilayer Conducting Polymer Electrode

Substrates are prepared as for Example 1. The PEDOT:PSS dispersion with low resistivity (<0.01 Ohms-cm, from Agfa) is further diluted with PSS to achieve four aqueous dispersions having a PEDOT:PSS ratio between 1:3 and 1:20 and a total solid content of ~1%. First the lowest resistivity (highest conductivity) PEDOT:PSS (the as received, undiluted <0.01 Ohms-cm) is spin coated onto the substrates at speeds between 500 to 5000 rpm for 180 sec. After spin coating, the film is annealed at 20-200° C. for 1-200 minutes. Then, the PEDOT:PSS dispersion with a PEDOT:PSS ratio of 1:3 is spin coated on top of the lowest resistivity polymer film and annealed in a similar way. A similar procedure is repeated with the PEDOT:PSS dispersions having PEDOT:PSS ratios of 1:5, 1:10 and 1:20. A uniform and pinhole free conducting polymer film 12 is formed. The total thickness of the film is generally less than 1 µm.

EXAMPLE 3

Formation of a Single Layer Conducting Polymer Film with a Continuous Change in Resistivity Across the Film Substrates 22 are prepared as for Example 1. An aqueous dispersion of the low resistivity PEDOT/PSS conducting polymer solution (<0.01 Ohms-cm, from Agfa), is spin coated onto the substrates at speeds between 500 to 5000 rpm for 180 sec. After spin coating, the film is annealed at 20-200° C. for 1-200 minutes. The conducting polymer film is patterned using the method described in U.S. Pat. No. 6,649,327. The active area of the patterned film is irradiated using a 254 nm UV lamp (~300 µW/cm² at a 15 cm distance) to create a conductivity gradient. The total thickness of the film 12' is generally less than 1 µm.

EXAMPLE 4

Organic Light Emitting Device Fabrication Using a Two Layered Conducting Polymer Anode Molecular organic light-emitting devices (MOLEDs) 10 are fabricated using a two-layer conducting polymer anode formed as described in Example 1 (only the highest conductivity PEDOT:PSS and the lowest conductivity PEDOT:PSS are used for the two-layered film formation). PET is used as the substrate 22. The conducting polymer film 12 is patterned using the method described in U.S. Pat. No. 6,649,327. The device configuration used for the experiment is as shown in FIG. 5, except that layers 40 and 46 are omitted. For the hole transporting layer 42, N,N'-Bis(naphthalene-1-yl)-N,N'-bis(phenyl)benzidine (α-NPB) was used as a hole transporter. For the light emitting layer 44, 1,2-bis(1-methyl-2,3,4,5,-tetraphenylsilacyclopentadienyl)ethane (2PSP) was used as an emitter. For the electron transporting layer 48, 2,5-bis-(2',2"-bipyridin-6-yl)-1,1-dimethyl-3,4-diphenylsilacyclopentadiene (PyPySPyPy) was used as an electron transporter. Organic layers comprising these materials are sequentially deposited on top of the multi-layered conducting polymer anode 12. The total thickness of the organic layers 42, 44, 48 is estimated to be ~110 nm. A 150-nm thick Mg:Ag film, prepared by co-evaporation of Mg and Ag at a weight ratio of 10 to 1, is deposited onto the organic layers using a shadow mask and is used as the cathode material 26.

Figure 6:
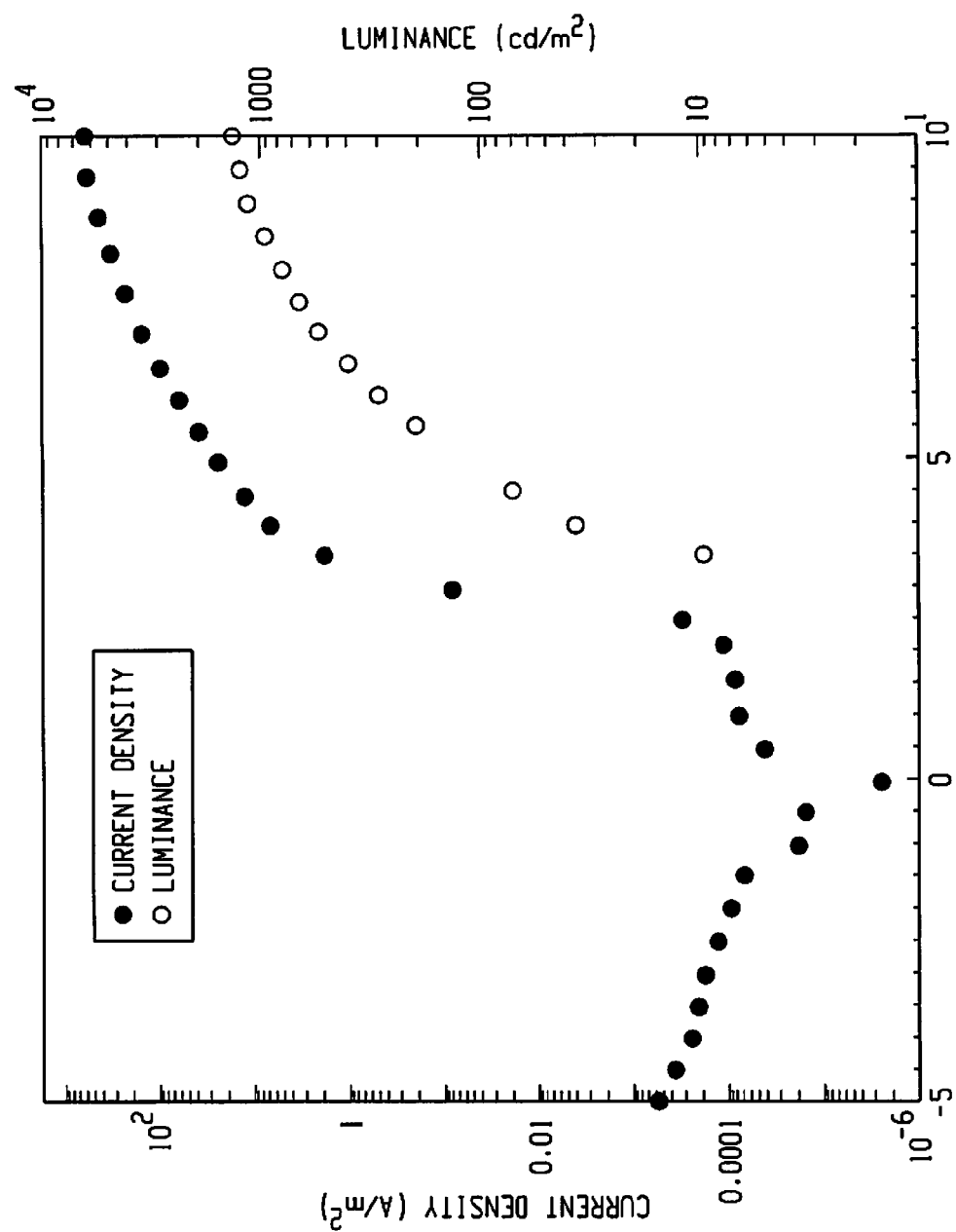
FIG. 6 is a plot of current density and luminance as a function of applied voltage for an OLED based on PET substrate/two-layered PEDOT:PSS anode/α-NPD layer/2PSP layer/PyPySPyPy layer/Mg:Ag cathode.

FIG. 6 shows a plot of the current density and the luminance as a function of applied voltage for an OLED formed as described (PET substrate/two-layered PEDOT:PSS anode/α-NPD/2PSP/PyPySPyPy/Mg:Ag). An excellent diode behavior with a rectification ratio of as high as about 10⁵ over the range ±5 V is observed from the device. The device shows very high external electroluminescence (EL) quantum efficiency (photons/electron) as well as luminous power efficiency, measured as lumen w⁻¹. For example, a peak external EL efficiency of 2% and a peak luminous power efficiency of 4.7 lm/W were measured. These values are much higher than measured for a comparative device formed analogously, except that it is based on a conducting single layer polymer anode of uniform conductivity throughout the layer.

Table 1 compares the performance of OLEDs with a four-layered conducting polymer anode device (Device A) according to the present exemplary embodiment with that of a single layer conducting polymer anode device (Device B). A dramatic enhancement in the device performance is obtained from the OLED using the multilayer conducting polymer anode with varying conductivity across the film.

TABLE 1

|  | Peak power efficiency (lm/W) | Peak external electroluminescence efficiency (%) | Rectification ratio @ ±5 V |
|---|---|---|---|
| Device A | 4.9 | 2.0 | 51000 |
| Device B | 1.2 | 0.8 | 11 |
| Percent improvement (%) | 308 | 150 | 463500 |

EXAMPLE 6

Organic Light Emitting Device Fabrication Using a 4-Layered Conducting Polymer Anode Molecular organic light-emitting devices (MOLEDs) are fabricated using a four-layer conducting polymer anode as described in Example 1. The conducting polymer film was patterned using the method described in U.S. Pat. No. 6,649,327. Organic layers including hole transporter α-NPD 42, and electron transporter/emitter, Alq$_3$ 44 were sequentially deposited on top of the four-layered conducting polymer anode 12. The total thickness of the organic layers is estimated to be ~110 nm. A 150-nm thick Mg:Ag film, prepared by co-evaporation of Mg and Ag at a weight ratio of 10 to 1, is deposited onto the organic layers using a shadow mask and is used as the cathode material 26. A comparative device was formed in the same way but using only a single-layered, conducting polymer anode of similar thickness but uniform conductivity.

Figure 7:
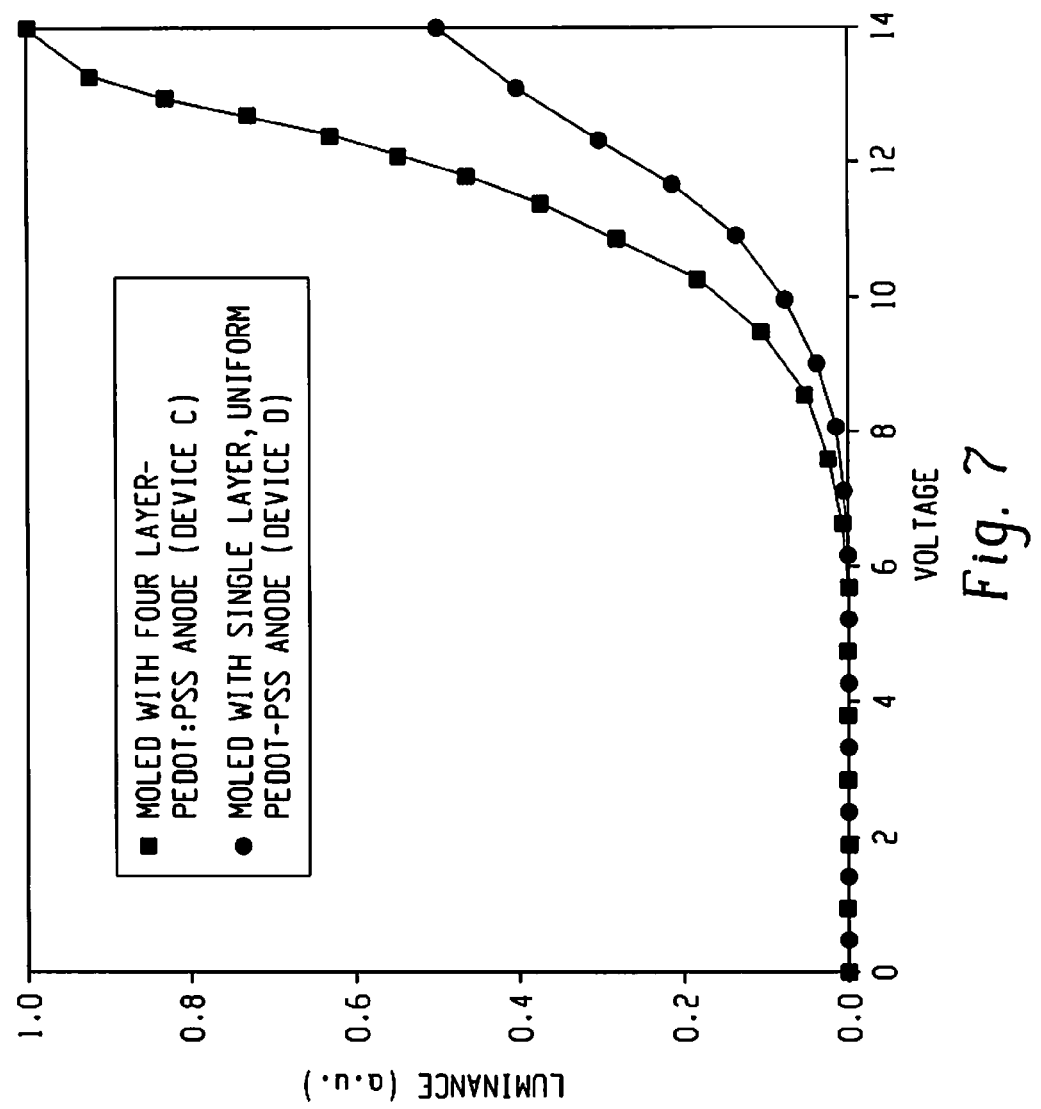
FIG. 7 is a plot of the relative luminance as a function of applied voltage for a) an OLED based on PET/four layer-PEDOT:PSS anode/α-NPD/Alq$_3$/Mg:Ag and b) a comparative OLED based on PET/gradientless single layer-PEDOT:PSS anode/α-NPD/Alq$_3$/Mg:Ag.

FIG. 7 shows a plot of the relative luminance as a function of applied voltage for an OLED based on PET/four layer-PEDOT:PSS anode/α-NPD/Alq$_3$/Mg:Ag (Device C) compared with the one fabricated on a single layer conducting polymer electrode without modification with a similar device structure (Device D). Device D is a control device using a single layer conducting polymer anode fabricated from PEDOT:PSS obtained from Agfa and no treatment or modification is made to vary the conductivity across the film. An enhancement in the luminance of as much as 100% is obtained from the OLED using the multilayer conducting polymer anode. For example, luminances (brightness) of 860 cd/m$^2$ and 425 cd/m$^2$ at 14V are obtained from device C and device D, respectively.

EXAMPLE 7

Organic Light Emitting Device Fabrication with the Conducting Polymer Anode with Continuous Change in Conductivity Molecular organic light-emitting devices (MOLEDs) are fabricated using a gradient-type single layered conducting polymer anode as described in Example 3. The conducting polymer film is patterned using the method described in U.S. Pat. No. 6,649,327. The hole transporter, α-NPD and the electron transporter/emitter, Alq$_3$ are sequentially deposited on top of a single layer conducting polymer anode 12' with continuous change in the conductivity obtained by UV irradiation (Device E). The total thickness of the organic layers is estimated to be ~110 nm. A 150-nm thick Mg:Ag film, prepared by co- evaporation of Mg and Ag at a weight ratio of 10 to 1, is deposited onto the organic layers using a shadow mask and is used as the cathode material. A comparative device (Device F) was prepared in the same way except that a single-layered conducting polymer anode without UV irradiation was used.

Figure 8:
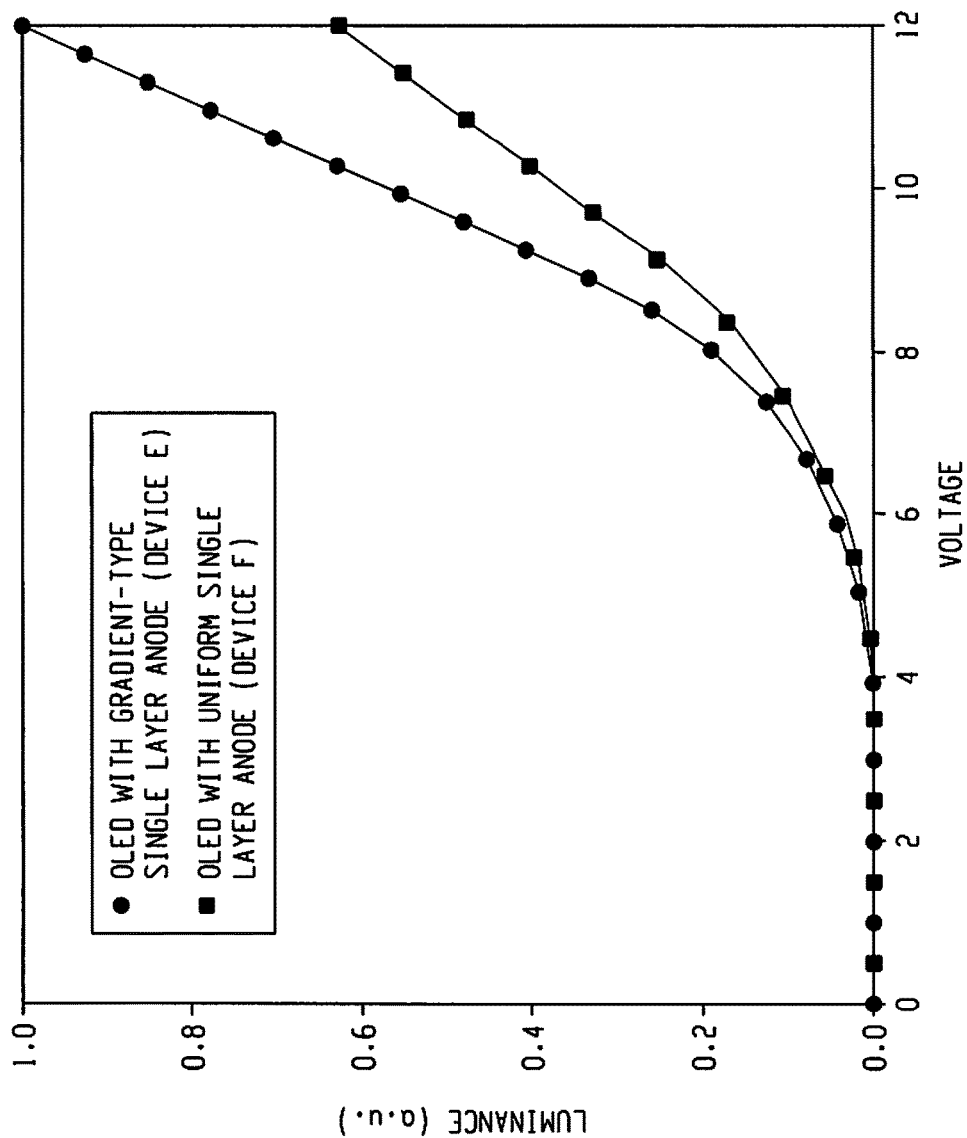
FIG. 8 is a plot of relative luminance as a function of applied voltage for an OLED with a single layer gradient type anode and a comparative OLED with a single layer anode with no conductivity gradient.

FIG. 8 shows a plot of the relative luminance as a function of applied voltage for an OLED based on PET substrate/single layered PEDOT:PSS anode with continuous change in the conductivity across the film obtained by UV irradiation/α-NPD/Alq$_3$/Mg:Ag (Device E) and a comparative device fabricated on a single layer conducting polymer electrode (without any treatment) using a similar device structure (device F). An enhancement in the luminance of as much as 60% is obtained from the OLED using the gradient conducting polymer anode 12. For example, luminances of 1840 cd/m$^2$ and 1100 cd/m$^2$ at 12V are obtained from the device E and device F, respectively.

EXAMPLE 8

Organic Photovoltaic Cell Fabrication

Figure 9:
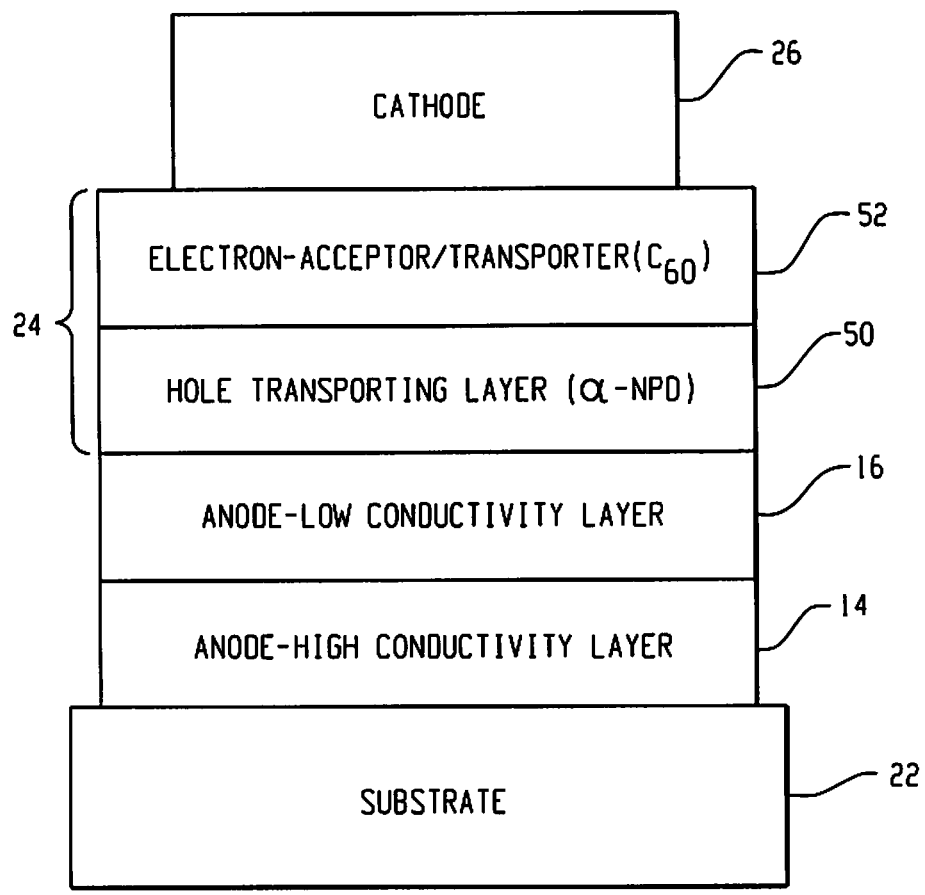
FIG. 9 is a schematic view of an exemplary OPV device.

Organic photovoltaic cells (OPVs) are fabricated as illustrated in FIG. 9 using a plastic substrate 22 and a two-layer conducting polymer anode 12 as described in Example 1 (only the highest conductivity PEDOT:PSS and the lowest conductivity PEDOT:PSS are used for the two-layered film formation). The conducting polymer film is patterned using the method described in U.S. Pat. No. 6,649,327. The hole transporting material α-NPD was used as an electron-donor/hole transporter in layer 50 and C$_{60}$ as the electron-acceptor/transporter in layer 52. The cathodes 26 for all devices are magnesium/silver alloy (~12:1 by mass) grown via codeposition of the metals from separate sublimation sources. Mg:Ag cathodes are deposited through a shadow mask producing devices having a 2 mm×2 mm (0.04 cm$^2$) active area.

Figure 10:
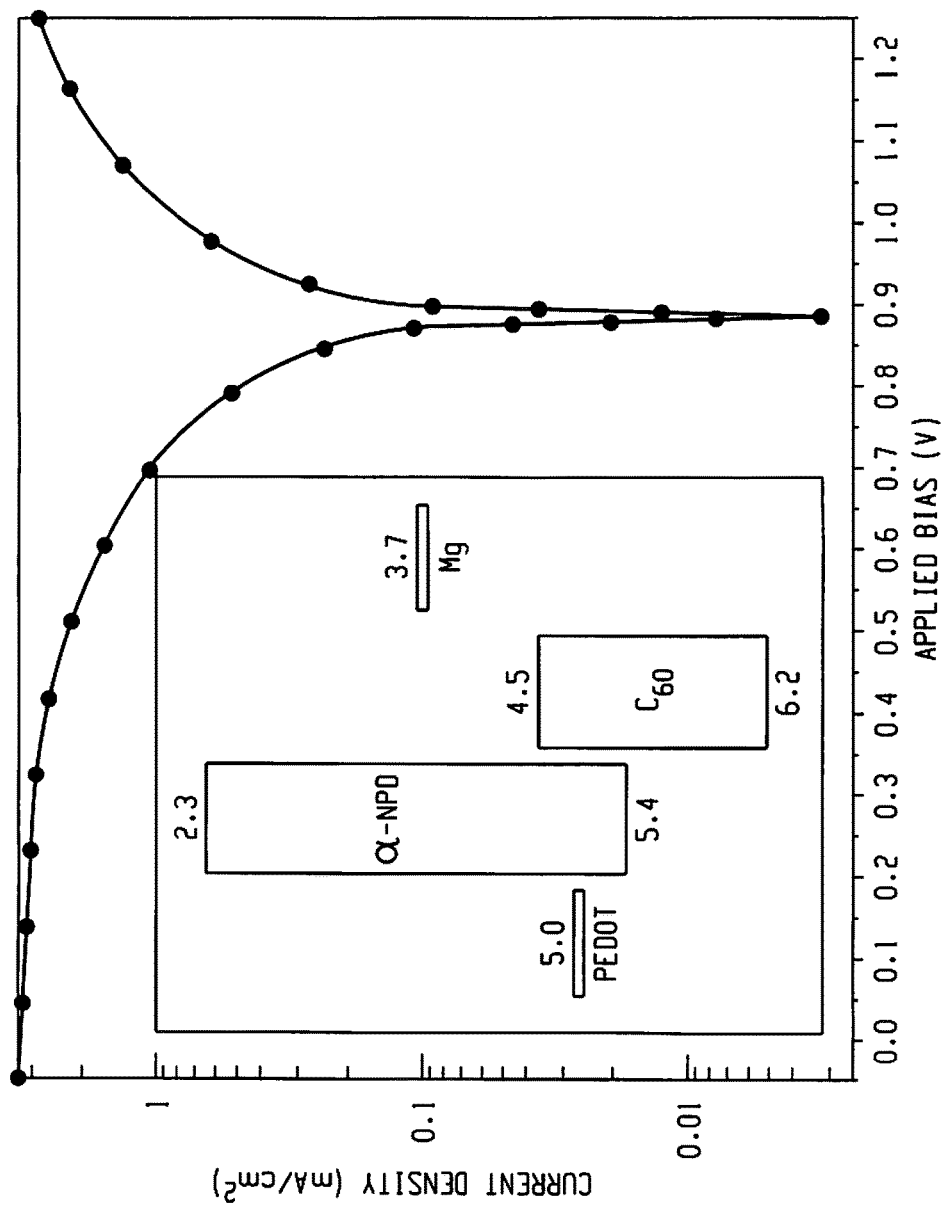
FIG. 10 illustrates current density vs. voltage for the device of FIG. 9.

FIG. 10 shows the current density/applied bias characteristics of the device built on the plastic substrate under 1 sun, white light illumination (AM1.5, 97 mW/cm$^2$) and varying incident light intensities. Under 1 sun illumination, these cells exhibit substantial open circuit voltages (V oc) of about 0.85 V and surprisingly large power conversion efficiencies (1.1%) considering these materials absorb very little light below 500 nm. An enhancement in the power conversion efficiency of as much as 80% is obtained from the OPV using the multilayer conducting polymer anode. For example, power conversion efficiencies of 1.1% and 0.61% are obtained from the device using two-layered conducting polymer anode and single layered conducting polymer anode (without any modification), respectively.

As the Examples above illustrate, the exemplary methods provide stable and efficient conductive films for many electronic and opto-electronic applications. Operational stability of the device is greatly improved compared to a conventional device with single layer conducting polymer anode. The device performance characteristics, such as luminance and efficiency, are also greatly improved. Since the device using the conducting polymer electrode disclosed herein has very low leakage current and extremely high rectification ratio, it can be used in high resolution matrix display devices, which has not been feasible with conventional polymer electrode devices.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method of forming an electronic device, comprising:
    forming a first electrode, wherein the first electrode comprises a conductive polymer electrode defining first and second surfaces and having an electrical conductivity gradient between the first and second surfaces, wherein forming the first electrode comprises depositing a solution comprising a conductive polymer and a dopant to form a first layer, and thereafter irradiating the first layer to produce a conductivity gradient in the first layer; and
    forming at least one organic material layer intermediate the first electrode and a second electrode.

* * * * *